United States Patent [19]
Maeno

[11] Patent Number: 5,829,015
[45] Date of Patent: Oct. 27, 1998

[54] SEMICONDUCTOR INTEGRATED CIRCUIT DEVICE HAVING MULTI-PORT RAM MEMORY WITH RANDOM LOGIC PORTION WHICH CAN BE TESTED WITHOUT ADDITIONAL TEST CIRCUITRY

[75] Inventor: Hideshi Maeno, Tokyo, Japan

[73] Assignee: Mitsubishi Denki Kabushiki Kaisha, Tokyo, Japan

[21] Appl. No.: 790,251

[22] Filed: Jan. 28, 1997

[30] Foreign Application Priority Data

Sep. 5, 1996 [JP] Japan ................................. 8-235051

[51] Int. Cl.$^6$ ............................. G06F 12/00; G06F 13/00
[52] U.S. Cl. .................. 711/104; 711/100; 711/101; 711/149; 365/189.02; 365/230.05
[58] Field of Search ....................... 711/100, 101, 711/104, 105, 149, 154; 365/189.02, 230.05; 371/22.3

[56] References Cited

U.S. PATENT DOCUMENTS

| | | | |
|---|---|---|---|
| 4,467,420 | 8/1984 | Murakami et al. ................. | 711/104 |
| 4,633,434 | 12/1986 | Scheuneman .......................... | 711/104 |
| 4,698,749 | 10/1987 | Bhadriraju ............................. | 711/104 |
| 4,780,660 | 10/1988 | Sakashita et al. ..................... | 371/22.3 |
| 4,870,345 | 9/1989 | Tomioka et al. ....................... | 371/22.3 |
| 4,873,686 | 10/1989 | Tada et al. ............................. | 371/22.4 |
| 5,113,511 | 5/1992 | Nelson et al. .......................... | 711/104 |
| 5,193,164 | 3/1993 | Shon ...................................... | 711/104 |
| 5,197,070 | 3/1993 | Maeno ................................... | 371/22.3 |
| 5,425,034 | 6/1995 | Ozaki ..................................... | 371/22.3 |
| 5,448,575 | 9/1995 | Hashizume ............................ | 371/22.3 |
| 5,491,825 | 2/1996 | Sakuma ................................. | 395/775 |
| 5,519,714 | 5/1996 | Nakamura et al. .................... | 371/22.3 |
| 5,617,428 | 4/1997 | Andoh ................................... | 371/22.3 |

FOREIGN PATENT DOCUMENTS 63-73451  4/1988  Japan.
2-297648 12/1990 Japan.

OTHER PUBLICATIONS

Chan et al., "Advanced Structured Arrays Combine High Density Memories with Channel–Free Logic Array", IEEE 1987 CICC, (1987), pp. 39–43.

Primary Examiner—Tod R. Swann
Assistant Examiner—Tuan V. Thai
Attorney, Agent, or Firm—Burns, Doane, Swecker & Mathis, LLP

[57] ABSTRACT

Multi-port RAM having a RAM core and signal transfer circuit transforming a predetermined signal between the RAM core and a random logic portion. The signal transfer circuit includes a scan path circuit. The scan path circuit for an address signal (ASCAN0), a scan path circuit for a data input signal (DSCAN0) and a selector circuit (ASEL) are provided on the write side, and no scan path circuit is provided on the read side. A read address is supplied through selector circuits (FSEL 2 and RSEL2) termed read address supply device provided on the read side. Thus, reduction of the test circuit allows area reduction of a chip and cost cutting in a semiconductor integrated circuit.

5 Claims, 12 Drawing Sheets

SEMICONDUCTOR INTEGRATED CIRCUIT DEVICE HAVING MULTI-PORT RAM MEMORY WITH RANDOM LOGIC PORTION WHICH CAN BE TESTED WITHOUT ADDITIONAL TEST CIRCUITRY

BACKGROUND OF THE INVENTION

1. Field of the Invention

The present invention relates to a semiconductor integrated circuit device, and more particularly to a semiconductor integrated circuit device which incorporates a RAM.

2. Description of the Background Art

FIG. 14 is a circuit diagram of a three-port (one-write and two-read) RAM 99 taken as an example of a background-art RAM with a built-in test circuit. The three-port RAM of this type can perform a write operation on the first address and read operations on the second and third addresses concurrently.

In FIG. 14, a RAM core 1 which is a main body of the RAM 99 receives and outputs the following signals through the respective ports. Specifically, a write enable signal WE0, a write address signal WA0 and a data input signal DI0 are inputted to the zero-th port (write port). A read-address signal RA1 is inputted to the first port (read port) and a data output signal DO1 is outputted from the first port. A read-address signal RA2 is inputted to the second port (read port) and a data output signal DO2 is outputted from the second port.

A configuration of a path for inputting/outputting the signals as above will be discussed. In this discussion, a circuit on the write side refers to a path for signals in association with the write port and a circuit on the read side refers to a path for signals in association with the read port.

The circuit on the write side includes a scan flip flop circuit for write control WSFF receiving a serial input signal of memory level (referred to as "SIM signal" hereinafter) which is externally applied from the outside of the RAM 99 and a write enable signal (referred to as "XWE0 signal" hereinafter) which is externally applied and outputting the first shift signal S1, a scan path circuit for address signal ASCAN0 receiving the first shift signal S1 and a write address signal on the zero-th port (referred to as "XWA0 signal" hereinafter) which is externally applied and outputting the second shift signal S2 and the write address signal WA0, and a scan path circuit for data input signal DISCAN0 receiving the second shift signal S2 and a data input signal on the zero-th port (referred to as "XDI0 signal" hereinafter) which is externally applied and outputting the third shift signal S3 and the data input signal DI0. The third shift signal S3 is given to the circuit on the read side.

The circuit on the write side further includes a flip flop FF1 receiving a write inhibit signal on the zero-th port (referred to as "WINH0 signal" hereinafter) which is externally applied, an AND gate G1 with one input inverted receiving the first shift signal S1 and an output of the flip flop FF1, and a write pulse generator WPG receiving an output of the AND gate G1 and generating the write enable signal WE0.

The circuit on the read side includes a scan path circuit for address signal ASCAN1 receiving a read address signal on the first port (referred to as "XRA1 signal" hereinafter) which is externally applied from the outside of the RAM 99 and the third shift signal S3 and outputting the fourth shift signal S4 and a signal S11, a scan path circuit for data output signal DOSCAN1 receiving the fourth shift signal S4 and the data output signal DO1 and outputting the fifth signal S5 and a signal S12, a scan path circuit for address signal ASCAN2 receiving the fifth shift signal S5 and a read address signal on the second port (referred to as "XRA2 signal" hereinafter) which is externally applied and outputting the sixth shift signal S6 and a signal S13, and a scan path circuit for data output signal DOSCAN2 receiving the sixth shift signal S6 and the data output signal DO2 and outputting a serial output signal of memory level (referred to as "SOM signal" hereinafter) and a signal S14.

The circuit on the read side further includes a selector circuit SELA1 receiving the signal S11 and the XRA1 signal and selectively outputting either of these signals as the read address signal RA1 in response to a RAM test signal (referred to as "RAMTST signal" hereinafter) which is externally applied, a selector circuit SELA2 receiving the signal S13 and the XRA2 signal and selectively outputting either of these signals as the read address signal RA2 in response to the RAMTST signal, a selector circuit SELDO1 receiving the signal S12 and the data output signal DO1 and selectively outputting either of these signals as an XDO1 signal in response to a logic test signal (referred to as "LOGICTST signal" hereinafter) which is externally applied, and a selector circuit SELDO2 receiving the signal S14 and the data output signal DO2 and selectively outputting either of these signals as an XDO2 signal in response to the LOGICTST signal.

Furthermore, a mode control signal SM for switching the operation mode into a normal mode (parallel mode)/shift mode is applied to the scan flip flop circuit for write control WSFF, the scan path circuit for address signal ASCAN1, the scan path circuit for data input signal DISCAN0, the scan path circuits for address signal ASCAN1 and ASCAN2, and the scan path circuits for data output signal DOSCAN1 and DOSCAN2. When the mode control signal is set to "1", the operation is brought into the shift mode, and specifically a series shift operation is made possible, where the applied SIM signal is transferred in sequence.

Though this figure shows no clock signal which is applied to the scan path circuits, the flip flop circuit, the scan flip flop circuit for write control and the write pulse generator, the circuits are assumed to be driven by the same clock signal. An operation of the RAM 99 will be discussed below.

The RAM 99 of FIG. 14 performs an asynchronous read operation where the data output signal is outputted behind a change of the read address by some interval of time in a normal operation. A configuration to implement this asynchronous read operation consists of the selector circuits SELA1, SELA2, SELDO1 and SELDO2.

In the normal operation, for example, since both the RAMTST signal and LOGICTST signal are set to "0", the XRA1 signal is directly applied to the RAM core 1 as the read address signal RA1 not through the scan path circuit ASCAN1, and the data output signal DO1 is outputted as the XDO1 signal not through the scan path circuit DOSCAN1. Similarly, the XRA2 signal is directly applied to the RAM core 1 as the read address signal RA2 not through the scan path circuit ASCAN1, and the data output signal DO2 is outputted as the XDO2 signal not through the scan path circuit DOSCAN2.

In this configuration, with the WINH0 signal set to "0", generation of write pulse is controlled by the signals to be inputted to the scan flip flop circuit for write control WSFF. For example, when the first shift signal S1 is "1", the AND gate G1 outputs "1" and the write pulse generator WPG generates a write pulse, and when the first shift signal S1 is "0", the AND gate G1 outputs "0" and the write pulse generator WPG does not generate a write pulse. Furthermore, the write pulse is generated in synchronization with the clock signal.

In this case, if the WINH0 signal is set to "1", the write pulse is not generated even if the clock signal is given, regardless of the signal applied to the scan flip flop circuit for write control WSFF. In other words, no information of the scan path is propagated to the write pulse generator WPG. That prevents an accidental write operation during the shift operation.

In the normal operation, to perform the write operation, it is necessary to generate the write pulse by setting both the WINH0 signal and the XWE0 signal to "0", to specify the write address by the XWA0 signal and the write data by the XDI0 signal, and to apply the clock signal. The write operation is performed in synchronization with the clock signal.

Now, a RAM test will be discussed. The RAM test refers to a test to verify whether the operations of writing data into the RAM core 1 and reading data out from the RAM core 1 are performed normally or not.

To write data in the RAM test, it is necessary to set the signal inputted to the scan flip flop circuit for write control WSFF to "0", to specify the write address by the XWA0 signal through the series shift operation of the scan path circuits ASCAN0 and DISCAN0, and to specify the write data by the XDI0 signal.

To read data in the RAM test, it is necessary to apply the read address signals RA1 and RA2 to the first and second ports, respectively, through the scan path circuits ASCAN1 and ASCAN2 since the RAMTST signal is "1". In this case, since the LOGICTST signal is "0", the data output signals DO1 and DO2 from the first and second ports are outputted not through the scan path circuits ASCAN1 or ASCAN2. Thus, a read test on the data from the first and second ports are performed.

Next, a logic test will be discussed. The logic test refers to a test to verify an operation of a random logic circuit provided in the periphery of the RAM 99. The random logic circuit includes a combinational circuit for outputting the XWA0 signal, the XRA1 signal and the XRA2 signal and another combinational circuit for receiving the XDO1 signal and the XDO2 signal. The logic test herein is made on the combinational circuit for outputting the XWA0 signal, the XRA1 signal and the XRA2 signal and the combinational circuit for receiving the XDO1 signal and the XDO2 signal.

Accordingly, in the logic test, it is necessary to output the XDO1 signal and the XDO2 signal through the scan path circuits DOSCAN1 and DOSCAN2, respectively, in the RAM 99 and to input the XWA0 signal, the XRA1 signal and the XRA2 signal through the scan path circuits ASCAN0, ASCAN1 and ASCAN2, respectively.

Thus, to perform the tests on the RAM 99 and the random logic circuit in the background-art RAM 99, it is necessary to provide the scan path circuits ASCAN0, DISCAN0, ASCAN1, ASCAN2, DOSCAN1 and DOSCAN2 and the like between the random logic circuit and the RAM core 1. These scan path circuits are not used in the normal operation, and provision of these circuits results in an increase in area of a chip to incorporate these circuits.

SUMMARY OF THE INVENTION

This present invention is directed to a semiconductor integrated circuit device. According to a first aspect of the present invention, the semiconductor integrated circuit device comprises: a multi-port RAM which can make a simultaneous access to a plurality of addresses; and a random logic portion for transferring a predetermined signal from/to the multi-port RAM. In the semiconductor integrated circuit device of the first aspect, the multi-port RAM comprises a RAM core which is a main body of the RAM; and signal transfer means for transferring the predetermined signal between the RAM core and the random logic portion. The signal transfer means has read address supply means connected to an address input terminal of a read port of the RAM core; and a scan path circuit connected to an address input terminal of a write port of the RAM core, for supplying a predetermined address signal. The read address supply means has a first function for supplying the address input terminal of the read port with fixed data which are fixed to a predetermined value as first address data in a first operation mode of the semiconductor integrated circuit device; a second function for supplying the address input terminal of the read port with held data which are held in the scan path circuit as second address data in a second operation mode of the semiconductor integrated circuit device; and a third function for supplying the address input terminal of the read port with first data outputted from the random logic portion as third address data in a third operation mode of the semiconductor integrated circuit device. The scan path circuit has a parallel input terminal for data and parallelly shifts at least second data outputted from the random logic portion to supply the address input terminal of the write port with the second data as the predetermined address signal. A data output terminal of the read port of the RAM core is directly given to the random logic portion.

According to a second aspect of the present invention, the signal transfer means comprises data selection means receiving the first and second data outputted from the random logic portion, for selectively supplying either the first data or the second data for the parallel input terminal in response to a selection control signal.

According to a third aspect of the present invention, the read address supply means has a first selector circuit for selectively outputting either the fixed data or the held data in response to a first control signal; and a second selector circuit for selectively outputting either the first data or an output of the first selector circuit in response to a second control signal. In the first operation mode, the first selector circuit selects and outputs the fixed data and the second selector circuit selects and outputs the output of the first selector circuit. In the second operation mode, the first selector circuit selects and outputs the held data and the second selector circuit selects and outputs the output of the first selector circuit. In the third operation mode, the second selector circuit selects and outputs the first data.

According to a fourth aspect of the present invention, the read address supply means has a logic gate circuit receiving the held data and either the first control signal or an inverted signal of the first control signal, for performing a logic operation and outputting a result of the logic operation; and a selector circuit for selectively outputting either the first data or an output of the logic gate circuit in response to the second control signal. The output of the logic gate circuit is connected to one of inputs of the selector circuit, and the first data is supplied to the other input of the selector circuit. The logic gate circuit has a logic to output a fixed value regardless of the held data in the first operation mode. The selector circuit selects and outputs the output of the logic gate circuit in the first and second operation modes, and the selector circuit selects and outputs the first data in the third operation mode.

According to a fifth aspect of the present invention, the signal transfer means comprises selection control signal generation means for generating the selection control signal. The selection control signal generation means receives at least a control signal indicating whether the semiconductor integrated circuit device is in the first operation mode or not, the selection control signal generation means selects either the first data or the second data in the first operation mode, and the selection control signal generation means generates the selection control signal for controlling the data selection means so as to select only the second data at least in the third operation mode among the second and third operation modes.

In the semiconductor integrated circuit device of the first aspect, the address input terminal of the read port is supplied with the fixed data which are fixed to the predetermined value as the first address data in the first operation mode of the device. Accordingly, the predetermined address signal supplied by the scan path circuit is equal to the fixed dataoperation. Since the read data rite through operation. Since the read data is given to the random logic portion from the read port of the RAM core, the test is implemented on the operation of the random logic portion receiving the read data. In the second operation mode of the device, the address input terminal of the read port is supplied with the held data which are held in the first scan path circuit as the second address data. Accordingly, the address of the write port of the RAM core is equal to the address of the read port, and the RAM core performs the write through operation. Thus, a test is implemented as to whether the data written into the RAM core are read out correctly or not. In the third operation mode of the device, the address input terminal of the read port is supplied with the first data outputted from the random logic portion as the third address data. The second data outputted from the random logic portion, being shifted in parallel, are supplied for the address input terminal of the write port as the address signal. Therefore, settings of write address and read address are made independently of each other, and the normal operation of the RAM core can be performed. Thus, the tests on the RAM core and the random logic portion and the normal operation of the RAM core can be performed, without providing any scan path circuit in the read port. Therefore, in the semiconductor integrated circuit device, size reduction is attained by reducing the number of the scan path circuits, and cost cutting is further attained.

In the semiconductor integrated circuit device of the second aspect, the signal transfer means includes the data selection means to selectively give either of the first and second data to the scan path circuit. The data are shifted in series in the scan path circuit and then given to the outside of the semiconductor integrated circuit device. Thus, the test is implemented on the operation of the random logic portion which generates the first and second data.

In the semiconductor integrated circuit device of the third aspect, a specific configuration of the read address supply means is provided.

In the semiconductor integrated circuit device of the fourth aspect, the specific configuration of the read address supply means is provided, and the circuit scale of the semiconductor integrated circuit device can be further reduced since only one type of selector circuits are used.

In the semiconductor integrated circuit device of the fifth aspect, the data selection means selects either the first or second data in the first operation mode, and selects only the second data in the third operation mode. Thus, it is possible to perform the test on the random logic portion which generates the first and second data in the first operation mode and perform the normal operation of the RAM core in the third operation mode.

An object of the present invention is to reduce the number of the test circuits in the semiconductor integrated circuit device, for reduction in area of the chip and cost cutting.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Preferred Embodiment

<A-1. Configuration>

Figure 1:
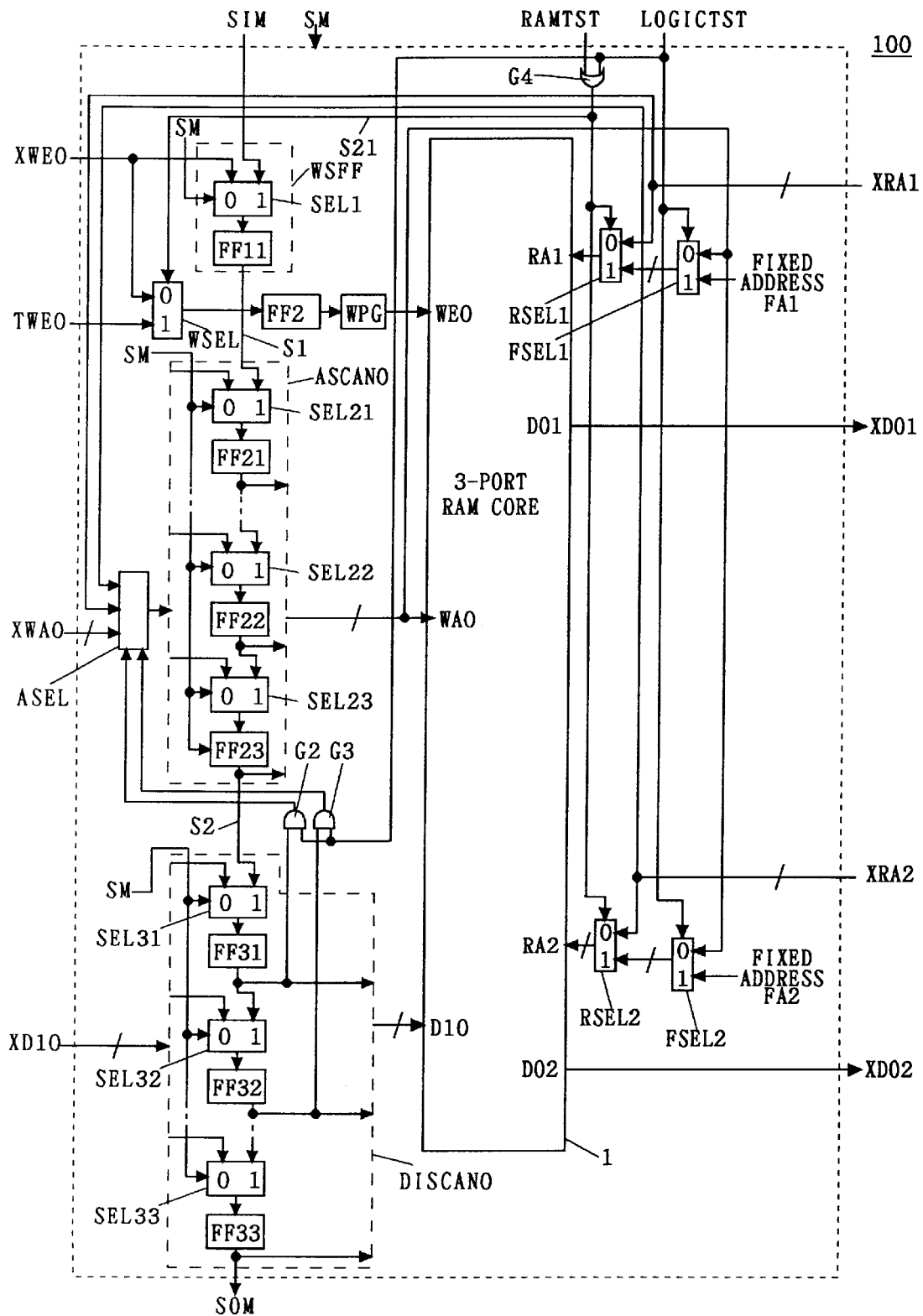
FIG. 1 illustrates a configuration of a semiconductor integrated circuit device in accordance with the present invention.

FIG. 1 illustrates a circuit configuration of a three-port (one-write and two-read) RAM 100 in accordance with the present invention.

In FIG. 1, the RAM core 1 which is a main body of the RAM 100 receives and outputs the following signals through respective ports. Specifically, the write enable signal WE0, the write address signal WA0 and the data input signal DI0 are inputted to the zero-th port (write port). The read-address signal RA1 is inputted to the first port (read port) and the data output signal DO1 is outputted from the first port. The read-address signal RA2 is inputted to the second port (read port) and the data output signal DO2 is outputted from the second port.

A configuration of a path for inputting/outputting the signals as above will be discussed. In this discussion, a circuit on the write side refers to a path for signals in association with the write port and a circuit on the read side refers to a path for signals in association with the read port. The circuits on the write and read sides are generally termed a test circuit, and may be also termed signal transfer means since it relates to the transfer of signals between the random logic circuit and the RAM core 1 as discussed later.

The circuit on the write side includes the scan flip flop circuit for write control WSFF receiving the SIM signal which is externally applied from the outside of the RAM 100 and the XWE0 signal which is externally applied and outputting the first shift signal S1, the scan path circuit for address signal ASCAN0 receiving the first shift signal S1 and an output signal from a selector circuit ASEL discussed later and outputting the second shift signal S2 and the write address signal WA0, and the scan path circuit for data input signal DISCAN0 receiving the second shift signal S2 and the XDI0 signal and outputting the SOM signal and the data input signal DI0.

The circuit on the write side further includes a selector circuit WSEL receiving the XWE0 signal and a write enable signal for test TWE0 which is externally applied and selectively outputting either of these signals in response to a signal S21 (discussed later) applied from the circuit on the read side, a flip flop FF2 receiving an output of the selector circuit WSEL, and the write pulse generator WPG receiving an output of the flip flop FF2 and generating the write enable signal WE0.

The circuit on the write side further includes a selector circuit ASEL receiving the XWA0 signal, the XRA1 signal and the XRA2 signal and selectively outputting one of the three signals in response to output signals S31 and S32 of AND gates G2 and G3 (discussed later) connected to the scan path circuit DISCAN0.

The scan flip flop circuit for write control WSFF includes a selector circuit SEL1 receiving the SIM signal and the XWE0 signal and selectively outputting either of these signals in response to the mode control signal SM which switches the operation mode into the normal/shift mode, and a flip flop FF11 receiving an output of the selector SEL1. With this configuration, an output of the flip flop FF11 is inputted to the scan path circuit ASCAN0 as the first shift signal S1.

The scan path circuit ASCAN0 consists of a plurality of selector circuits and flip flops which are provided correspondingly to the multi-bit input and connected alternately in series. Specifically, a selector circuit SEL21 receiving the first shift signal S1 is positioned uppermost and a flip flop FF21 receiving an output of the selector circuit SEL21 is positioned subsequently. An output of the flip flop FF21 is given to a subsequent selector circuit and the same is given to the RAM core 1 as the write address signal WA0. A plurality of such configurations connected to one another constitute the scan path circuit ASCAN0.

The selector circuit SEL21 receives the first shift signal S1 and an output of the selector circuit ASEL and selectively outputs either of these signals in response to the mode control signal SM. In FIG. 1, a selector circuit SEL23 and a flip flop FF23 are positioned in the final stage and a selector circuit SEL22 and a flip flop FF22 are positioned in the previous stage.

An output of the flip flop FF23 is given to the scan path circuit DISCAN0 as the second shift signal S2.

The scan path circuit DISCAN0 has the same configuration as the scan path circuit ASCAN0. Specifically, a selector circuit SEL31 receiving the second shift signal S2 is positioned uppermost and a flip flop FF31 receiving an output of the selector circuit SEL31 is positioned subsequently. An output of the flip flop FF31 is given to a subsequent selector circuit and the same is given to the RAM core 1 as the data input signal DI0.

The selector circuit SEL31 receives the second shift signal S2 and the XDI0 signal and selectively outputs either of these signals in response to the mode control signal SM. In FIG. 1, a selector circuit SEL32 is connected to the flip flop FF31 and a flip flop FF32 is connected to the selector circuit SEL32 and a selector circuit SEL33 and a flip flop FF33 are positioned in the final stage.

An output of the flip flop FF33 is outputted to the outside of the RAM 100 as the SOM signal.

The output of the flip flop FF31 is given to one of inputs of the AND gate G2 and an output of the flip flop FF32 is given to one of inputs of the AND gate G3. The LOGICTST signal (the first control signal) is applied to the other inputs of the AND gates G2 and G3.

The circuit on the read side includes a selector circuit FSEL1 receiving a fixed address signal FA1 and the write address signal WA0 and selectively outputting either of these signals in response to the LOGICTST signal, and a selector circuit RSEL1 receiving the XRA1 signal and an output signal of the selector circuit FSEL1 and selectively outputting either of these signals as the read address signal RA1 in response to the signal S21 (discussed later).

The circuit on the read side further includes a selector circuit FSEL2 receiving a fixed address signal FA2 and the write address signal WA0 and selectively outputting either of these signals in response to the LOGICTST signal, and a selector circuit RSEL2 receiving the XRA1 signal and an output signal of the selector circuit FSEL2 and selectively outputting either of these signals as the read address signal RA2 in response to the signal S21 (discussed later). Furthermore, the selector circuits FSEL1 and RSEL1 and the selector circuits FSEL2 and RSEL2 may be termed read address supply means.

The signal S21 (the second control signal) is an output signal of a NOR gate G4 which receives the LOGICTST signal and the RAMTST signal.

The data output signals DO1 and DO2 are directly outputted from the RAM core 1 as the XDO1 signal and the XDO2 signal.

<A-2. Operation>

An operation of the RAM 100 will be discussed, referring to FIGS. 1, 2, 3A to 3H and 4A to 4H. FIG. 1 shows no clock signal applied to the scan path circuits, the flip flop circuit, the scan flip flop circuit for write control and the write pulse generator, but it is assumed that these circuits are driven by the same clock signal.

<A-2-1. Normal Operation>

First, in the normal operation (the third operation mode), since both the RAMTST signal and the LOGICTST signal are set to "0", the NOR gate G4 outputs "0", and in the circuit on the write side, the selector circuit WSEL gives the XWE0 signal to the flip flop FF2 and the write pulse generator WPG outputs the write enable signal WE0 in response to the XWE0 signal. Thus, the RAM core 1 is brought into a writable mode.

At this time, since the mode control signal SM is "0", the scan path circuit ASCAN0 gives the output of the selector circuit ASEL to the RAM core 1 as the write address signal WA0 and the scan path circuit DISCAN0 gives the XDI0 signal to the RAM core 1 as the data input signal DI0, thereby determining write data.

The selector circuit ASEL, which selectively outputs one of the XRA1 signal, the XRA2 signal and the XWA0 signal in response to the output signals S31 and S32 of the AND gates G2 and G3, selects the XWA0 signal in the normal operation and specifies a write address according to the XWA0 signal. Furthermore, the AND gates G2 and G3 give the output signals S31 and S32, respectively, so that the selector circuit ASEL may select one of the XRA1 signal, the XRA2 signal and the XWA0 signal, and accordingly the output signals S31 and S32 may be termed selection control signals and the AND gates G2 and G3 may be termed selection control signal generation means.

In the circuit on the read side, the XRA1 signal is inputted to the RAM core 1 as the read address signal RA1 and the data output signal DO1 is outputted as the XDO1 signal. Similarly, the XRA2 signal is inputted to the RAM core 1 as the read address signal RA2 and the data output signal DO2 is outputted as the XDO2 signal.

<A-2-2. RAM Test>

In the RAM test (the second operation mode), since the RAMTST signal is set to "1" and the LOGICTST signal is set to "0", the NOR gate G4 outputs "1", and in the circuit on the write side, the selector circuit WSEL gives the write enable signal for test TWE0 which is externally applied to the flip flop FF2 and the write pulse generator WPG outputs the write enable signal WE0 in response to the write enable signal for test TWE0. Thus, the RAM core 1 is brought into the writable mode.

Further, in the RAM test, since the mode control signal SM is set to "1", the scan flip flop circuit for write control WSFF and the flip flops in the scan path circuit ASCAN0 and DISCAN0 transfer the SIM signal applied thereto in sequence, and in other words, perform the series shift operation.

The output of the scan path circuit ASCAN0 is given to the RAM core 1 as the write address signal WA0 and to the selector circuits FSEL1 and FSEL2. Since the LOGICTST signal is "0" and the output of the NOR gate G4 is "1", the output of the scan path circuit ASCAN0 is given to the RAM core 1 as the read address signals RA1 and RA2 through the selector circuits FSEL1 and FSEL2 and the selector circuits RSEL1 and RSEL2.

Since an output of the scan path circuit DISCAN0 is written at an address specified by the write address signal WA0 as the data input signal DI0, the data output signals DO1 and DO2 are outputted from an address specified by the read address signals RA1 and RA2, i.e., the address at which the data input signal DI0 is written.

Then, a check is made as to whether the data output signals DO1 and DO2 are equal to the data input signal DI0, thus completing the RAM test.

Furthermore, as to means for checking the data output signals DO1 and DO2, an external configuration disclosed in a patent application (Application No. is JP 7-140605) may be used after outputting the data output signals DO1 and DO2 to external pins of the LS1, and a detailed discussion thereof is omitted.

<A-2-3. Logic Test>

Figure 2:
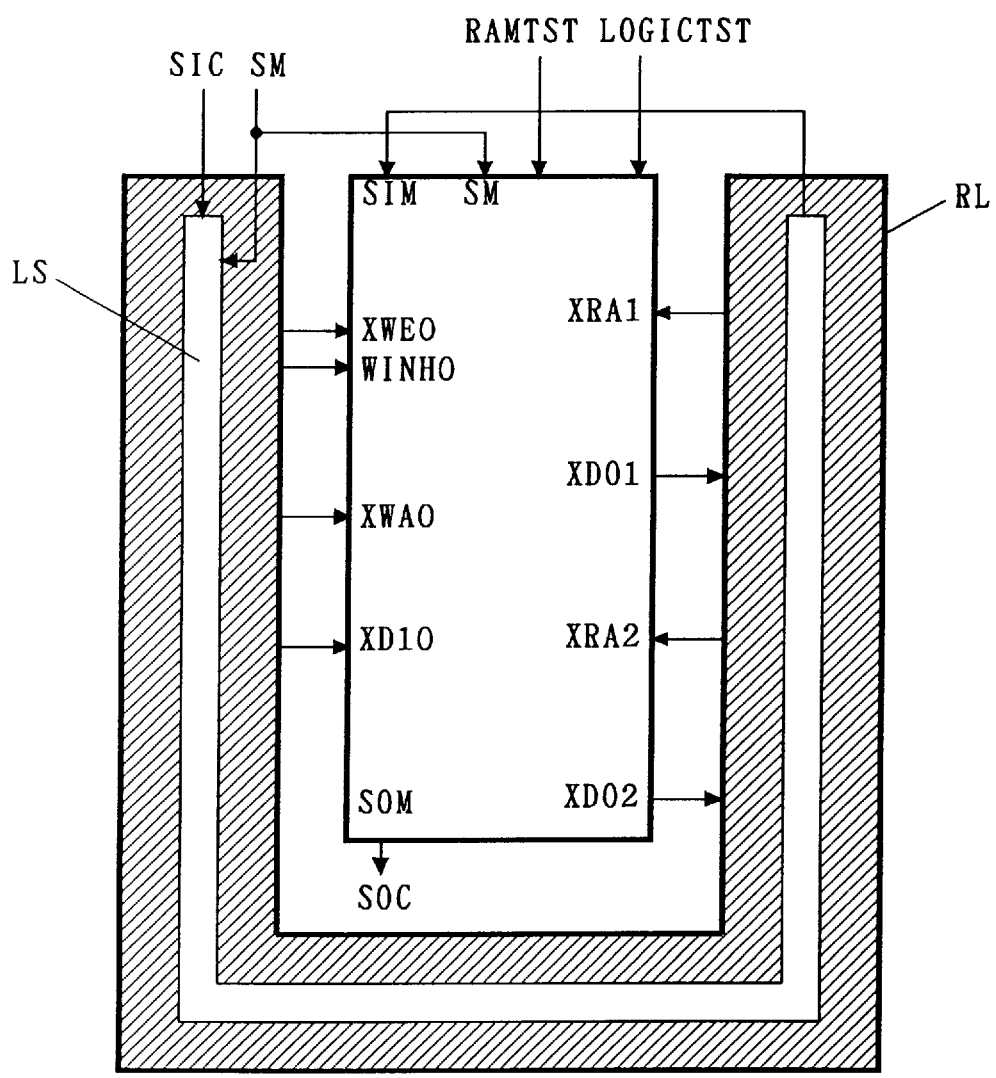
FIG. 2 illustrates a connection between a RAM and logic circuits in the periphery thereof.
Figure 3:
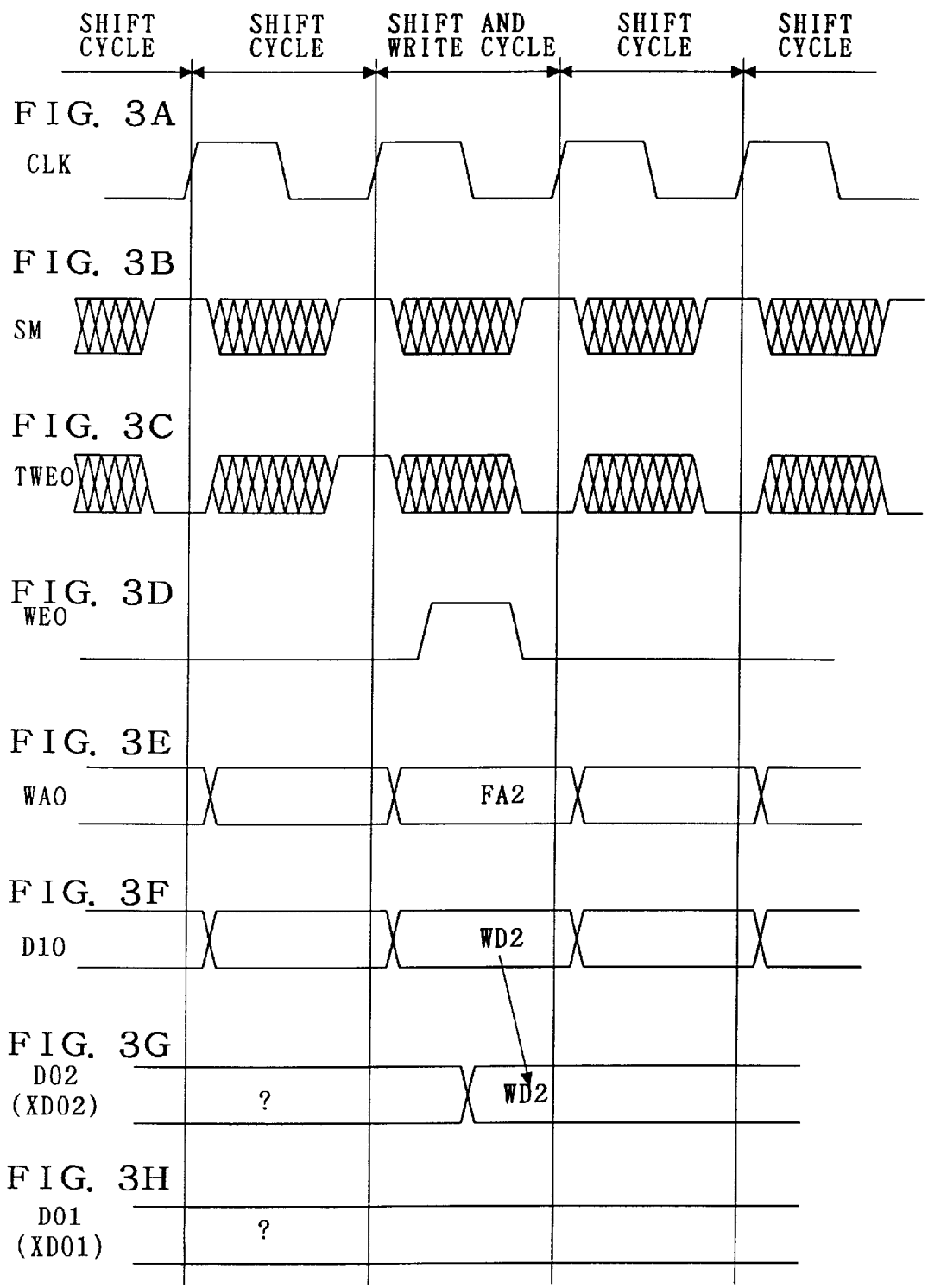
FIGS. 3A to 3H are timing charts showing an operation of a logic test made by the semiconductor integrated circuit device in accordance with the present invention.
Figure 4:
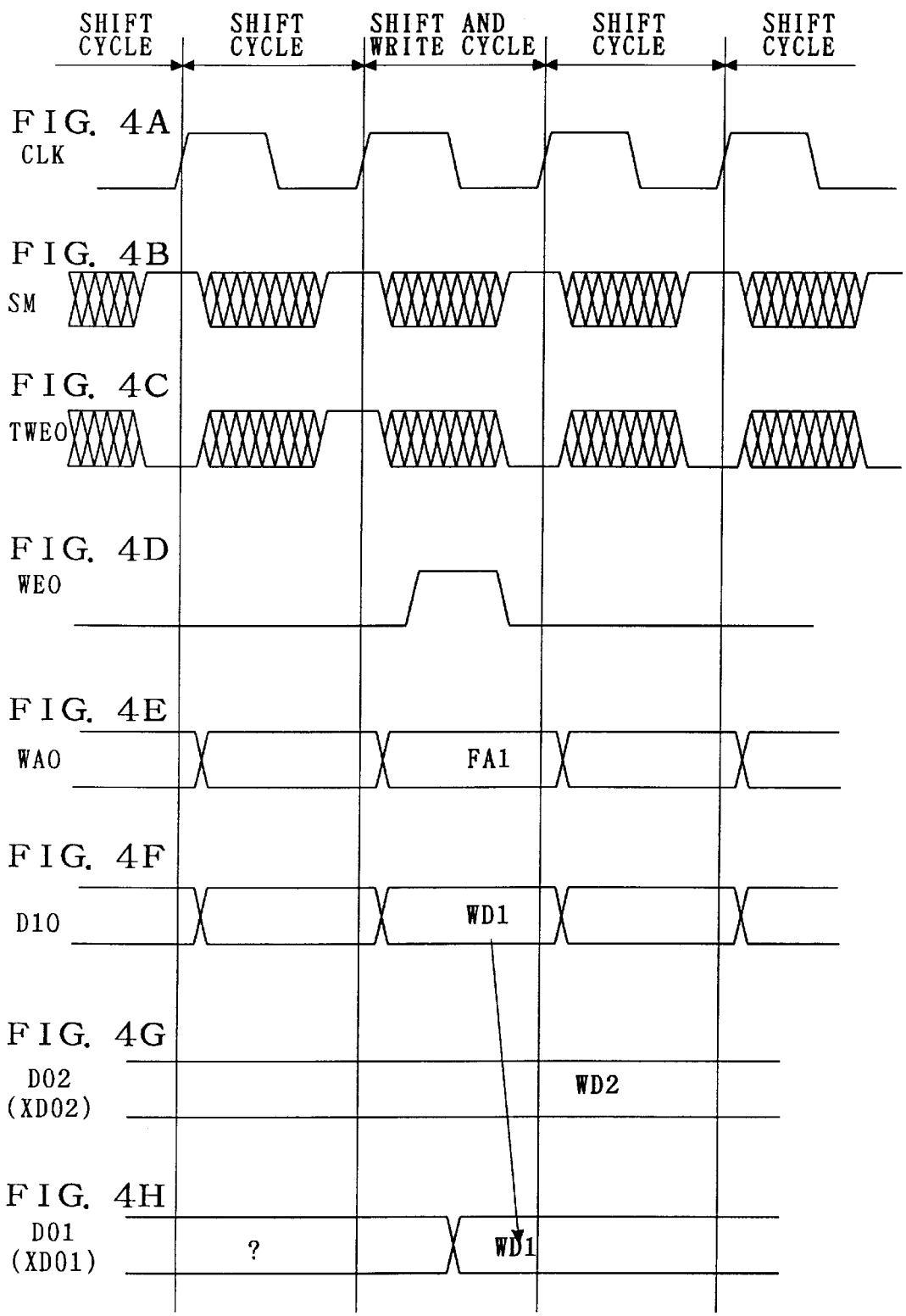
FIGS. 4A to 4H are timing charts showing the operation of the logic test made by the semiconductor integrated circuit device in accordance with the present invention.

FIG. 2 is a circuit diagram of a semiconductor integrated circuit device incorporating the RAM 100 discussed with reference to FIG. 1.

In FIG. 2, a random logic circuit RL is provided around the RAM 100. Inside the random logic circuit RL, a logic scan path circuit LS is provided.

As shown in FIG. 2, a serial input signal of chip level (referred to as "SIC signal" hereinafter) is applied to the logic scan path circuit LS and it is given to the scan path circuit in the RAM 100 as the SIM signal through the logic scan path circuit LS, and accordingly the logic scan path circuit LS and the scan path circuit in the RAM 100 are connected in series. Furthermore, the SOM signal from the RAM 100 is outputted to the outside of the semiconductor integrated circuit device as a serial output signal of chip level (referred to as "SOC signal" hereinafter).

The random logic test (logic test, hereinafter) herein refers to a test on the random logic circuit RL provided between the scan path circuit in the RAM 100 and the logic scan path circuit LS, and in more detail, a combinational circuit for outputting the XWA0 signal, the XRA1 signal and the XRA2 signal and another combinational circuit for receiving the XDO1 signal and the XDO2 signal.

An operation of the logic test (the first operation mode) will be discussed, referring to FIGS. 3A to 3H, 4A to 4H and 5A to 5K. First, an operation of the test on the combinational circuit for receiving the XDO1 signal and the XDO2 signal.

In the logic test, since the RAMTST signal is set to "0" and the LOGICTST signal is set to "1", the NOR gate outputs "1".

As shown in FIGS. 3A to 3H, if the mode control signal SM is "1" on a rise of the clock signal CLK, the scan flip flop circuit for write control WSFF and the flip flops in the scan path circuits ASCAN0 and DISCAN0 transfer the SIM signal applied thereto through the series shift operation. A cycle where the series shift operation is made is termed a shift cycle.

On the next rise of the clock signal CLK, the write enable signal for test TWE0 is set to "1". Since the NOR gate G4 outputs "1", the selector circuit WSEL gives "1" to the flip flop FF2 and the write pulse generator WPG outputs a pulse signal (write pulse) as the write enable signal WE0.

While the write pulse of "1" is given, data are written at the address specified by the write address signal WA0. Specifically, shift data are determined so that the fixed address FA2 obtained through the series shift operation of the SIM signal may be inputted as the write address WA0 signal from the scan path circuit ASCAN0 and data WD2 obtained through the series shift operation of the SIM signal may be inputted as the data input signal DI0 from the scan path circuit DISCAN0. Furthermore, this cycle is termed a shift and write cycle.

At this time, in the circuit on the read side, since the fixed address FA2 is given to the RAM core 1 as the read address signal RA2, the written data WD2 are outputted as the data output signal DO2 and given to the random logic circuit RL as the XDO2 signal. On this point of time, the data output signal DO1 is indefinite, and the shift cycle starts again.

An operation for making the data output signal DO1 definite will be discussed, referring to FIGS. 4A to 4H. FIGS. 4A to 4H are continued from FIGS. 3A to 3H. After the data output signal DO2 is made definite, the shift cycle is repeated a predetermined number of times, and on the rise of the clock signal CLK thereafter, the write enable signal TWE0 is set to "1".

Since the output of the NOR gate G4 is "1", the selector circuit WSEL gives "1" to the flip flop FF2 and a pulse signal (write pulse) is outputted as the write enable signal WE0 from the write pulse generator WPG.

While the write pulse of "1" is given, data are written at the address specified by the write address signal WA0. Specifically, the shift data are determined so that the fixed address FA1 may be inputted as the write address signal WA0 and data WD1 may be inputted as the data input signal DI0.

At this time, in the circuit on the read side, since the fixed address FA1 is given to the RAM core 1 as the read address signal RA1, the written data WD1 are outputted as the data output signal DO1 and given to the random logic circuit RL as the XDO1 signal. On this point of time, the data output signals DO1 and DO2 are made definite.

It is necessary to use the fixed addresses FA1 and FA2 which are different from each other. For example, the fixed address FA1 is determined address 1 and the fixed address FA2 is determined address 2.

In response to the data output signals DO1 and DO2, the combinational circuit in the random logic circuit RL operates and the operation result is given to the logic scan path circuit LS in a parallel mode. Subsequently, by changing the operation mode of the logic scan path circuit LS into the serial mode, the operation result is given to the RAM 100 as the SIM signal through the series shift operation. The SIM signal (operation result) goes through the scan path circuits in the RAM 100, and is outputted as the SOM signal. The SOM signal is finally outputted to the outside of the chip as the SOC signal, and a check is thereby made whether the operation result is normal or not.

An operation of the test on the circuit for outputting the XWA0 signal, the XRA1 signal and the XRA2 signal will be discussed, referring to FIGS. 5A to 5K. FIGS. 5A to 5K are continued from FIGS. 4A to 4H. After the data output signals DO1 and DO2 are made definite, the shift cycle is repeated a predetermined number of times. FIGS. 5A to 5K show a state after the repeats of the shift cycle.

The SIC signal applied to the logic scan path circuit LS in the random logic circuit RL of FIG. 2 is transferred through the series shift operation to the combinational circuit for outputting the XWA0 signal, the XRA1 signal and the XRA2 signal in the parallel mode, to generate the XWA0 signal, the XRA1 signal and the XRA2 signal.

Figure 5:
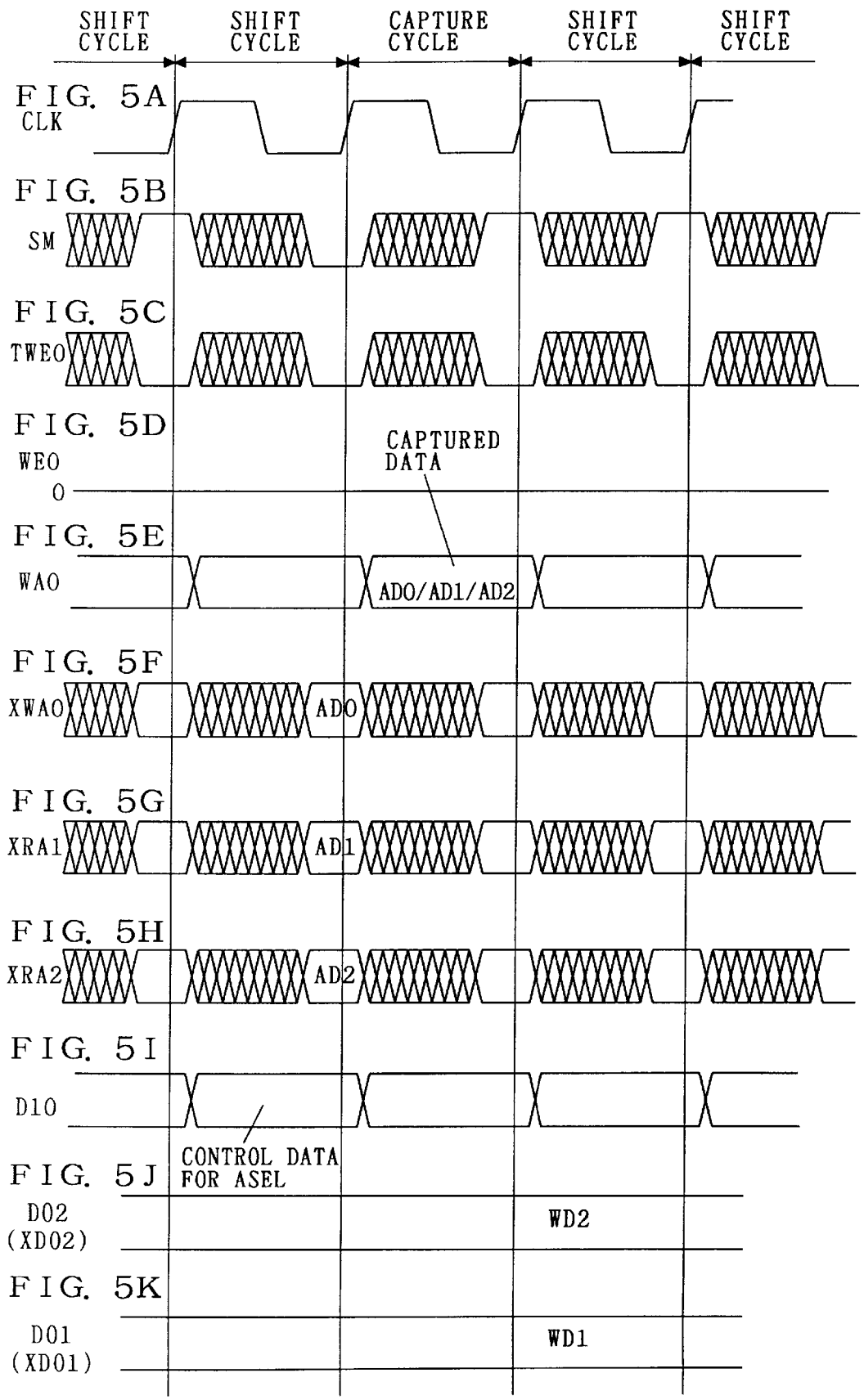
FIGS. 5A to 5K are timing charts showing the operation of the logic test made by the semiconductor integrated circuit device in accordance with the present invention.

In this test, since it is not necessary to input the XWAO signal, the XRA1 signal and the XRA2 signal to the RAM core 1, there is no need for generating the write pulse and accordingly the write enable signal for test TWE0 turns "0" on every rise of the clock signal CLK as shown in FIG. 5C. Therefore, the write enable signal WE0 remains "0".

The selector circuit ASEL selects one of the XWA0 signal, the XRA1 signal and the XRA2 signal and outputs it. If the mode control signal SM is "0" on the rise of the clock signal CLK, the scan path circuit ASCAN0 is brought into the parallel mode, to capture the selected signal therein. The captured signal is outputted as the write address signal WA0 through the flip flops in the scan path circuit ASCAN0. This cycle is termed a capture cycle.

In this case, since the write enable signal WE0 is "0", the captured signal is not written into the RAM core 1. When the mode control signal SM turns "1", the scan path circuits ASCAN0 and DISCAN0 start the series shift operations, and the captured signal is outputted as the SOM signal. The SOM signal is finally outputted to the outside of the chip as the SOC signal, and a check is thereby made whether the captured signal is correct or not.

In FIGS. 5F to 5H, the XWA0 signal, the XRA1 signal and the XRA2 signal which may be captured in the capture cycle are shown as signals AD0, AD1 and AD2. Which of these signals is captured depends on the data input signal DI0 outputted from the scan path circuit DISCAN0.

Specifically discussing, since the selector circuit ASEL is controlled by the output signals S31 and S32 of the AND gates G2 and G3 connected to the scan path circuit DISCAN0, an operation of the selector circuit ASEL changes according to the data input signal DI0. In FIG. 5I, the data input signal DI0 which is used for controlling the selecting operation of the selector circuit ASEL is represented as "control data for ASEL".

At this time, since the LOGICTST signal is "1", "1" is given to one of the inputs of the AND gate G2 and one of the inputs of the AND gate G3. Accordingly, the outputs of the AND gates G2 and G3 reflect the outputs of the flip flops FF31 and FF32.

B. The First Variation

In the RAM 100 in accordance with the preferred embodiment of the present invention, the selector circuit ASEL is controlled by the output signals S31 and S32 of the AND gates G2 and G3 connected to the scan path circuit DISCAN0, i.e., the held data of the scan path circuit DISCAN0. It is not always necessary, however, that the AND gates G2 and G3 are connected to the scan path circuit DISCAN0.

Figure 6:
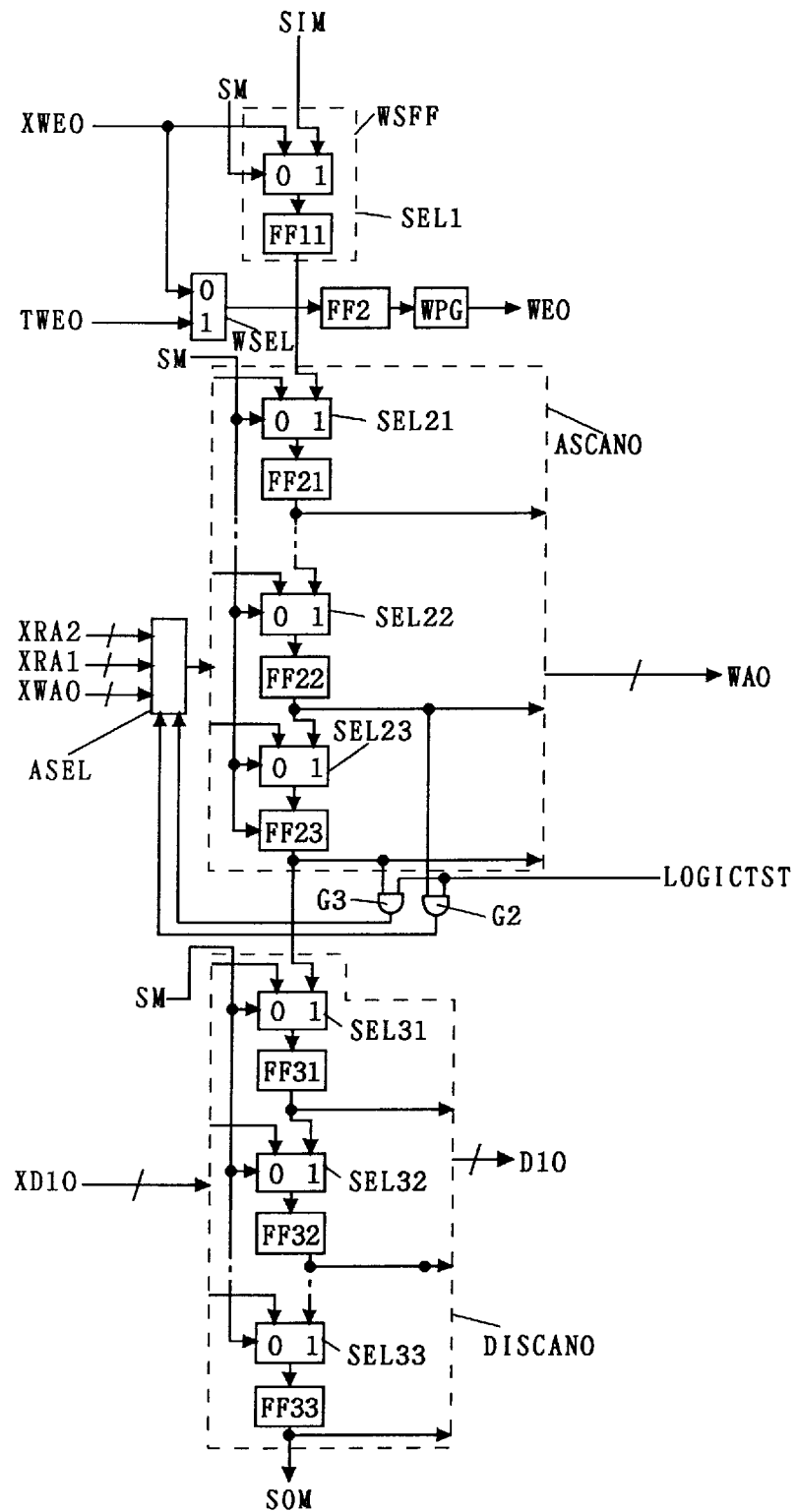
FIGS. 6 and 7 illustrate variations of the semiconductor integrated circuit device in accordance with the present invention.

As shown in FIG. 6, there may be a configuration where the selector circuit ASEL is controlled by the held data of the scan path circuit ASCAN0.

Specifically, in FIG. 6, the output of the flip flop FF22 of the scan path circuit ASCAN0 is given to one of the inputs of the AND gate G2 as well as the selector circuit SEL23, and the output of the flip flop FF23 is given to one of the inputs of the AND gate G3 as well as the selector circuit SEL31. The LOGICTST signal is applied to the other inputs of the AND gates G2 and G3. The output signals S31 and S32 of the AND gates G2 and G3 are given to the selector circuit ASEL.

Figure 7:
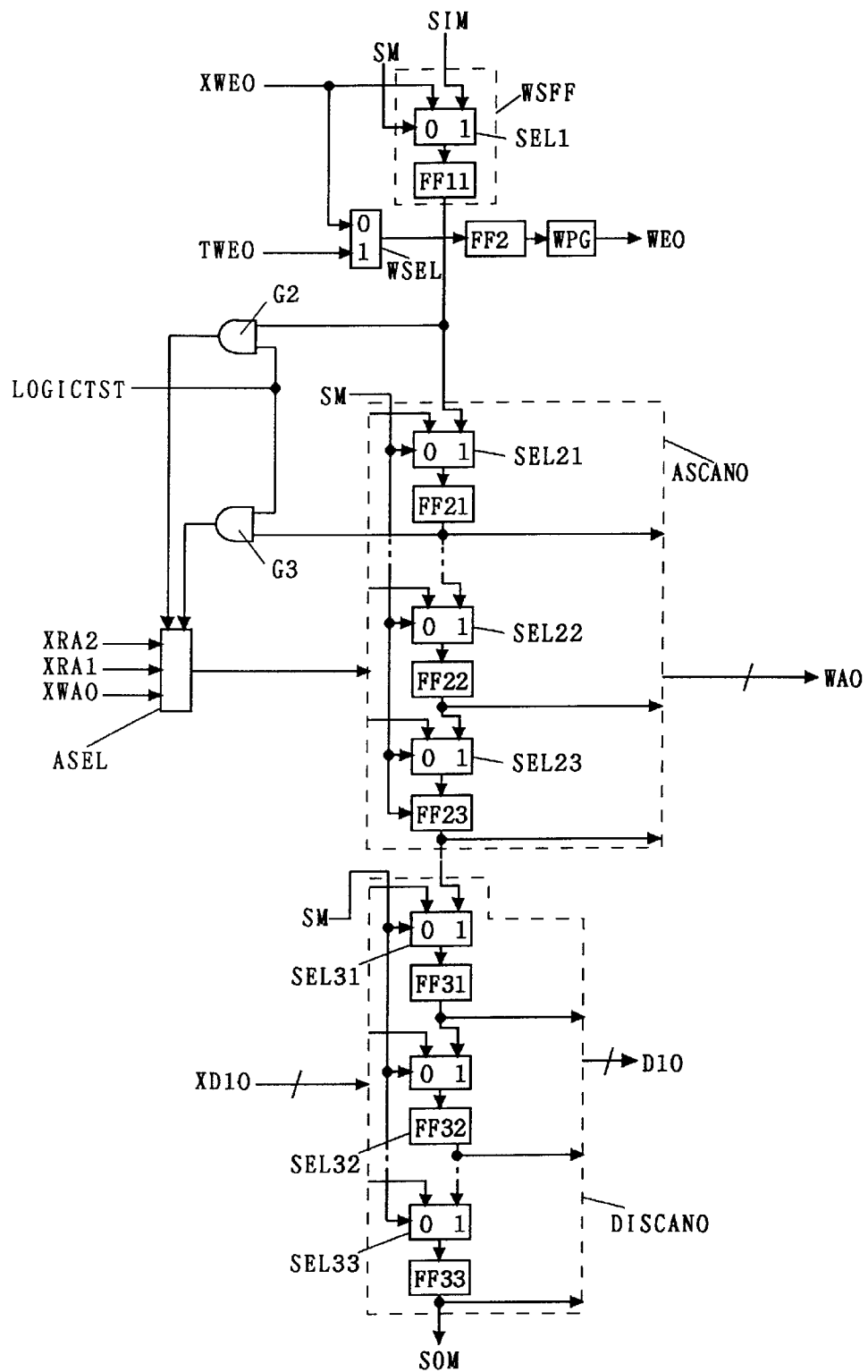

As shown in FIG. 7, there may be a configuration where the selector circuit ASEL is controlled by the held data of the scan flip flop circuit for write control WSFF and the scan path circuit ASCAN0.

Specifically, in FIG. 7, the output of the flip flop FF11 of the scan flip flop circuit for write control WSFF is given to one of the inputs of the AND gate G2 as well as the selector circuit SEL21, and the output of the flip flop FF21 of the scan path circuit ASCAN0 is given to one of the inputs of the AND gate G3. The LOGICTST signal is applied to the other inputs of the AND gates G2 and G3. The output signals S31 and S32 of the AND gates G2 and G3 are given to the selector circuit ASEL.

Thus, the control signal for the selector circuit ASEL may be generated from any of the held signals of the scan path circuits or may be generated from a combination of the held signals of the scan path circuit and the scan flip flop circuit for write control. Further, the control signal may be generated from the held data of the flip flops constituting the logic scan path circuit LS in the random logic circuit RL of FIG. 2.

C. The Second Variation

The RAM 100 in accordance with the preferred embodiment of the present invention is a three-port (one-write and two-read) RAM. Accordingly, the selector circuit ASEL has three data inputs and two control inputs.

Figure 8:
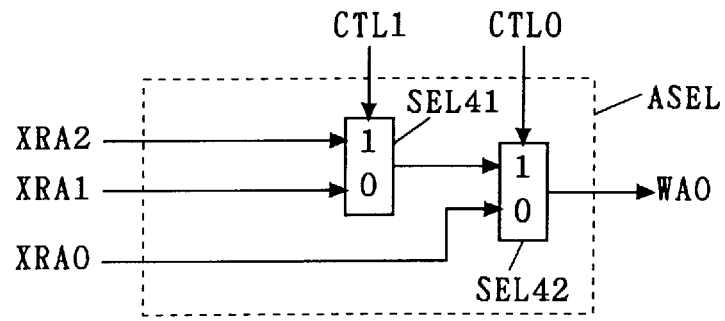
FIG. 8 illustrates a configuration of a selector circuit in the semiconductor integrated circuit device in accordance with the present invention.

FIG. 8 illustrates an exemplary configuration of the selector circuit ASEL in the RAM 100. In FIG. 8, selector circuits SEL41 and SEL42 are provided in the selector circuit ASEL.

The selector circuit SEL41 receives the XRA1 signal and the XRA2 signal and selectively outputs either of these signals in response to a control signal CTL1. The selector circuit SEL42 receives the XWA0 signal and an output of the selector circuit SEL41 and selectively outputs either of these signals as the write address signal WA0 in response to a control signal CTL2.

The control signals CTL1 and CTL2 are the output signals S31 and S32 of the AND gates G2 and G3, respectively.

In the normal operation, since both the output signals S31 and S32 of the AND gates G2 and G3 are "0", the write address signal WA0 is outputted. Thus, inputting the XWA0 signal to the selector circuit on the write side makes it possible to suppress degradation of speed performance to a minimum in the normal operation (in a case of selection of the XWA0 signal).

Then, the present invention can be applied to not only the three-port RAM but also a four-port RAM, a five-port RAM and a RAM with much more ports.

Figure 9:
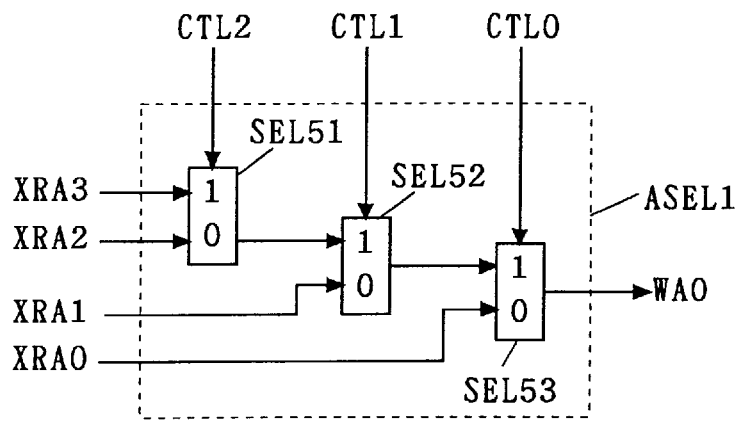
FIGS. 9 and 10 illustrate another configurations of the selector circuit in the semiconductor integrated circuit device in accordance with the present invention.

When the present invention is applied to the four-port (one-write and three-read) RAM, for example, a configuration of FIG. 9 may be used.

Specifically, selector circuits SEL51 to SEL53 are provided in a selector circuit ASEL1 used for the four-port RAM.

The selector circuit SEL51 receives an XRA3 signal and the XRA2 signal and selectively outputs either of these signals in response to the control signal CTL2. The selector circuit SEL52 receives the XRA1 signal and an output signal of the selector circuit SEL51 and selectively outputs either of these signals in response to the control signal CTL1. The selector circuit SEL53 receives the XWA0 signal and an output signal of the selector circuit SEL52 and selectively outputs either of these signals as the write address signal WA0 in response to a control signal CTL0. The XRA3 signal is a read address signal which is applied to the third read port from the outside.

Thus, inputting the XWA0 signal to the selector circuit on the write side makes it possible to suppress degradation of speed performance to a minimum in the normal operation (in a case of selection of the XWA0 signal).

Figure 10:
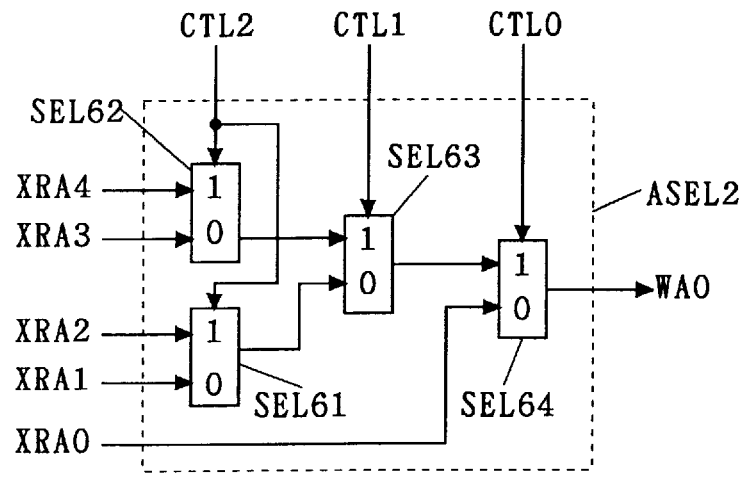

When the present invention is applied to the five-port (one-write and four-read) RAM, a configuration of FIG. 10 may be used.

Specifically, selector circuits SEL61 to SEL64 are provided in a selector circuit ASEL2 used for the five-port RAM.

The selector circuit SEL61 receives the XRA1 signal and the XRA2 signal and selectively outputs either of these signals in response to the control signal CTL2. The selector circuit SEL62 receives the XRA3 signal and an XRA4 signal and selectively outputs either of these signals in response to the control signal CTL2. The selector circuit SEL63 receives output signals of the selector circuits SEL61 and SEL62 and selectively outputs either of these signals in response to the control signal CTL1. The selector circuit SEL64 receives the XWA0 signal and an output signal of the selector circuit SEL63 and selectively outputs either of these signals as the write address signal WA0 in response to the control signal CTL0. The XRA3 signal and the XRA4 signal are read address signals which are applied to the third read port and the fourth read port, respectively, from the outside.

Thus, inputting the XWA0 signal to the selector circuit on the write side makes it possible to suppress degradation of speed performance to a minimum in the normal operation (in a case of selection of the XWA0 signal).

Further, the present invention can be applied to a RAM with much more ports. For example, when the present invention is applied to a six-port (two-write and four-read) RAM, two RAMs 100 of FIG. 1 may be used.

Furthermore, although the above discussions have been made on a case where the write port is dedicated to the write operation, the present invention can be applied to a RAM with writable and readable port.

D. The Third Variation

The RAM 100 in accordance with the preferred embodiment of the present invention includes the selector circuits FSEL1 and FSEL2 serving as means for supplying the fixed address FA1 and FA2. In FIG. 1, the fixed addresses FA1 and FA2, which are given to one of the data inputs of the selector circuit FSEL1 and one of the data inputs of the selector circuit FSEL2, are shown as if changeable. In fact, however, the fixed addresses FA1 and FA2 are not changeable. Specifically discussing, one of the data inputs of the selector circuit FSEL1 and one of the data inputs of the selector circuit FSEL2 are connected to the ground potential or the power supply potential, and the potentials of the selector circuits FSEL1 and FSEL2 are fixed. Thus, the fixed addresses FA1 and FA2 are determined.

Figure 12:
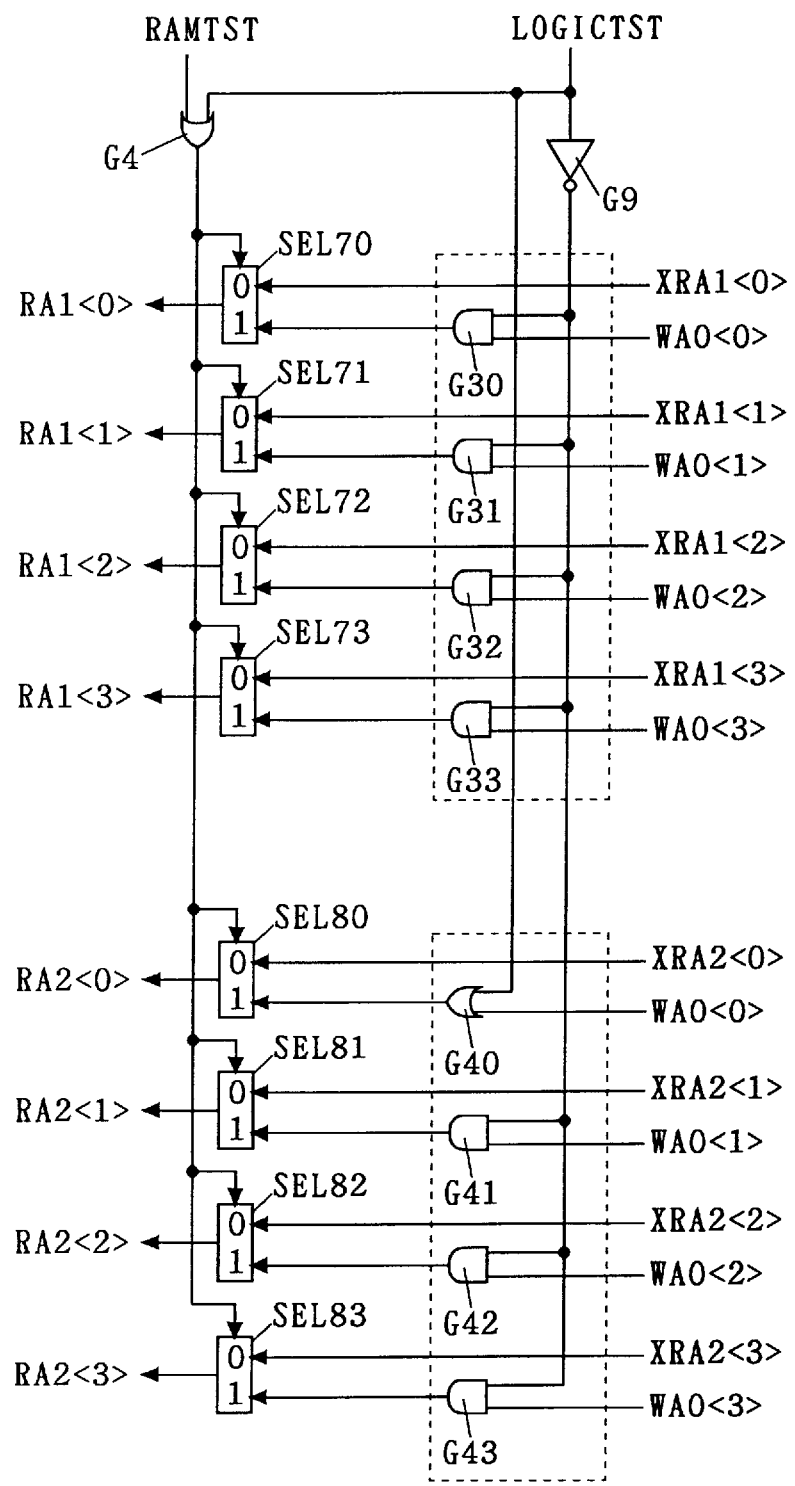
FIGS. 12 and 13 illustrate another configurations of the read address supply means in the semiconductor integrated circuit device in accordance with the present invention.
Figure 13:
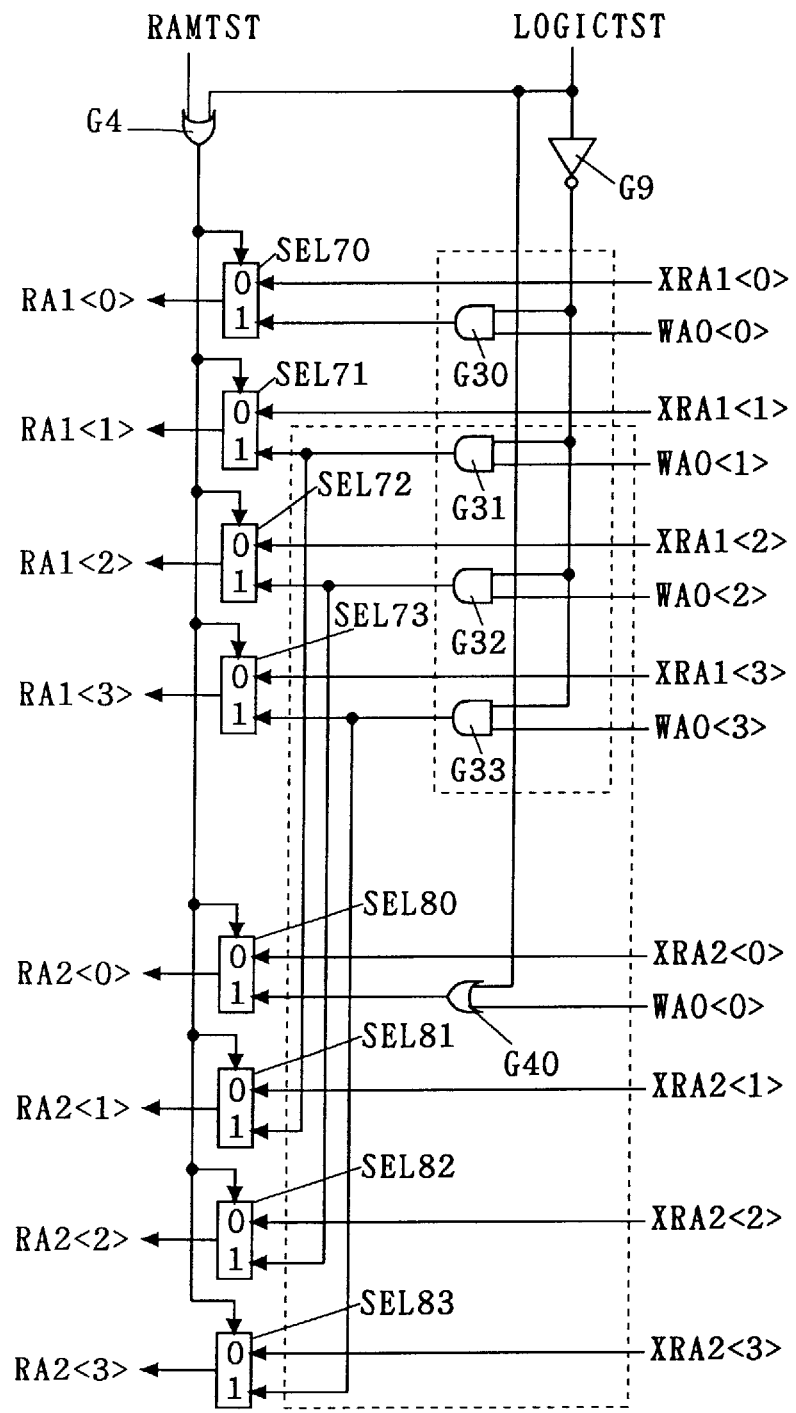
Figure 14:
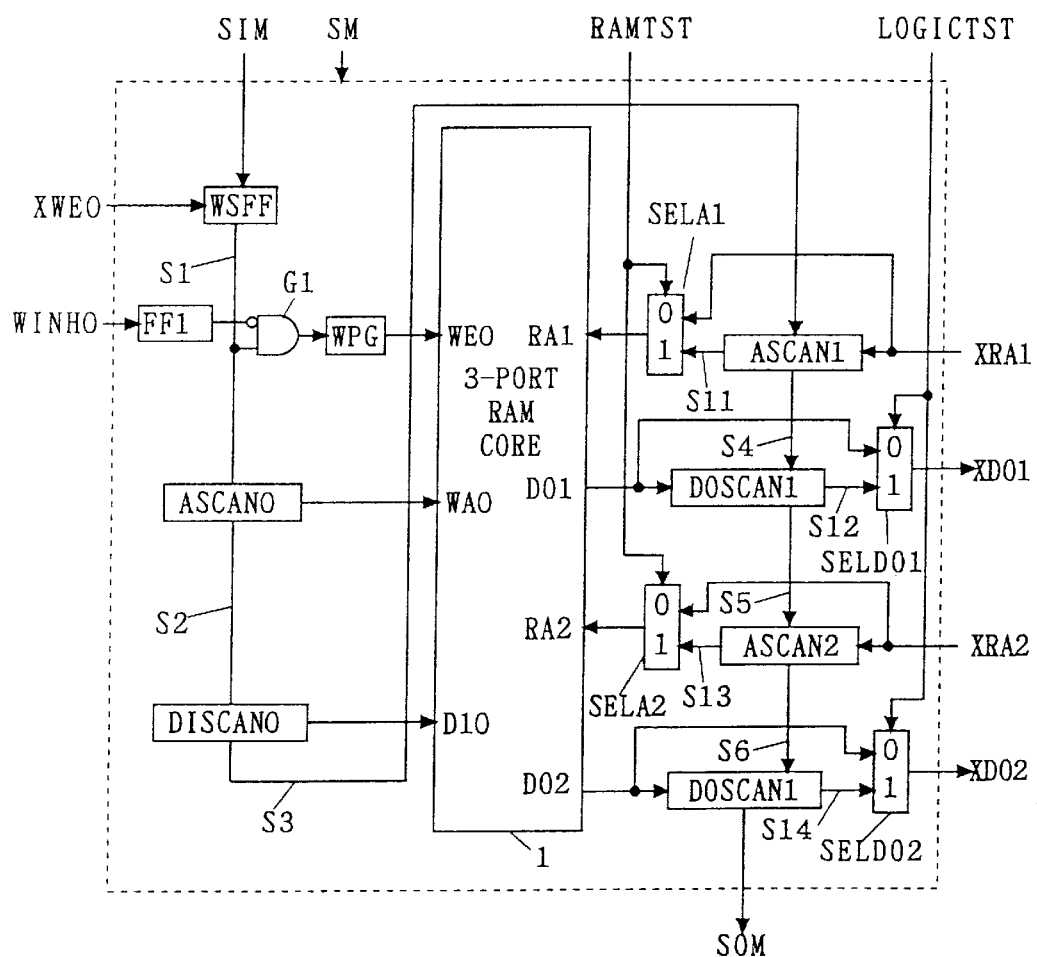
FIG. 14 illustrates a configuration of a semiconductor integrated circuit device in the background art.

If the fixed addresses FA1 and FA2 are not changeable, it is not necessary to employ the selector circuits occupying large area, and instead AND gates or OR gates occupying small area may be used. Exemplary configurations of this case are shown in FIGS. 11 to 13.

Figure 11:
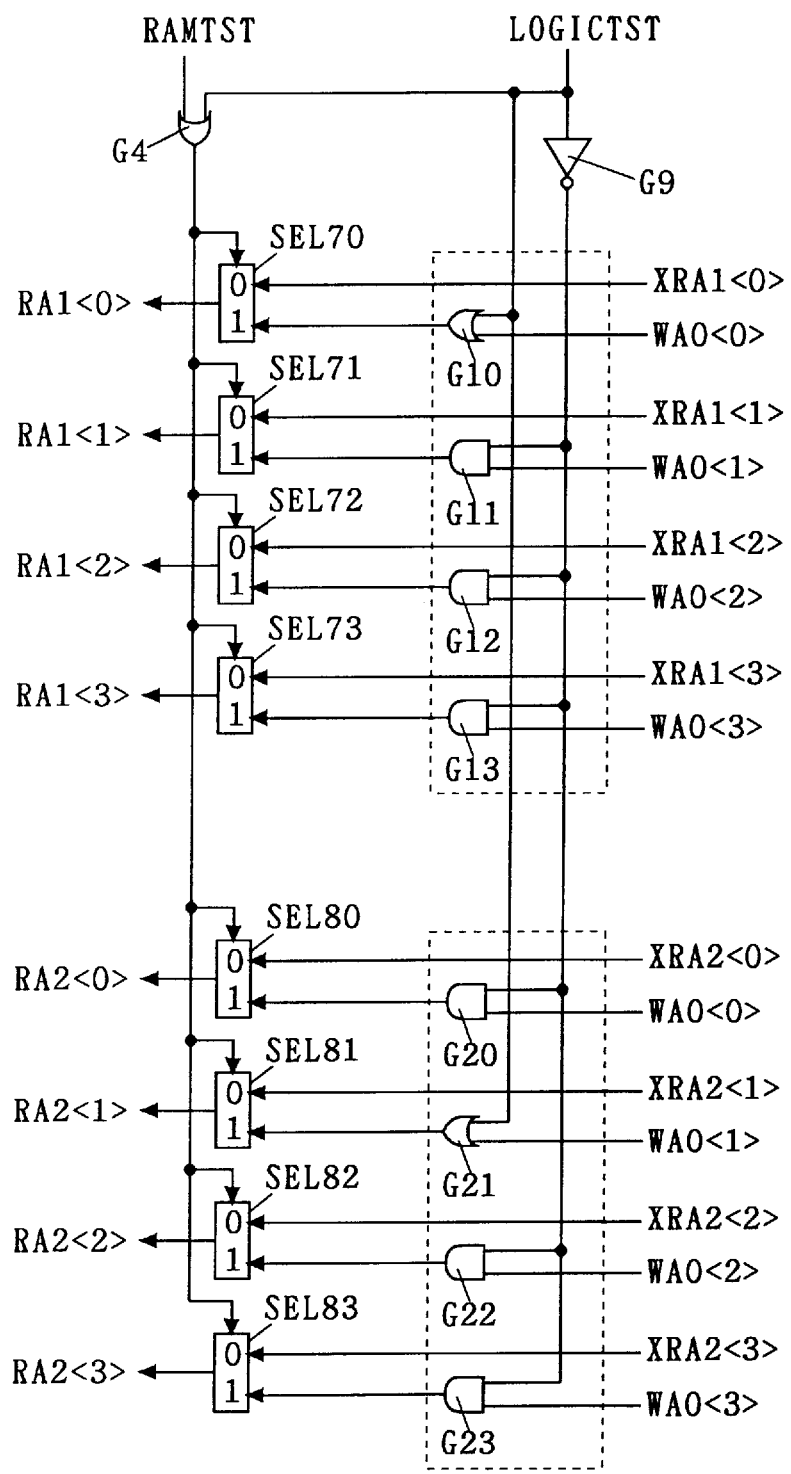
FIG. 11 illustrates a configuration of a read address supply means in the semiconductor integrated circuit device in accordance with the present invention.

FIG. 11 shows selector circuits SEL70 to SEL73 serving as the selector circuit RSEL1 of FIG. 1. While FIG. 1 shows the selector circuit RSEL1 as a typical one, for simple illustration, FIG. 11 shows an example of configuration with four-bit bus. Similarly, FIG. 11 shows selector circuits SEL80 to SEL83, instead of the selector circuit RSEL2 of FIG. 1.

An output of an OR gate G10 is connected to one of inputs of the selector circuit SEL70, an output of an AND gate G11 is connected to one of inputs of the selector circuit SEL71, an output of an AND gate G12 is connected to one of inputs of the selector circuit SEL72, and an output of an AND gate G13 is connected to one of inputs of the selector circuit SEL73. The XRA1(0) to XRA1(3) signals are applied to the other inputs of the selector circuits SEL70 to SEL73, respectively. Outputs of the selector circuits SEL70 to SEL73 are given to the RAM core 1 as read address signals RA1(0) to RA1(3).

An output of an AND gate G20 is connected to one of inputs of the selector circuit SEL80, an output of an OR gate G21 is connected to one of inputs of the selector circuit SEL81, an output of an AND gate G22 is connected to one of inputs of the selector circuit SEL82, and an output of an AND gate G23 is connected to one of inputs of the selector circuit SEL83. The XRA2(0) to XRA2(3) signals are applied to the other inputs of the selector circuits SEL80 to SEL83, respectively. Outputs of the selector circuit SEL80 to SEL83 are given to the RAM core 1 as read address signals RA2(0) to RA2(3).

In FIG. 11, the fixed address FA1 is determined address 1 by the OR gate G10 and the AND gates G11 to G13 and the fixed address FA2 is determined address 2 by the AND gate G20, the OR gate G21 and the AND gates G22 and G23.

Specifically, an inverted signal of the LOGICTST signal is applied to respective ones of inputs of the AND gates G11 to G13 and the AND gates G20, G22 and G23 through an inverter G9 and the LOGICTST signal is applied to respective ones of inputs of the OR gates G10 and G21.

When the LOGICTST signal of "1" is given in the logic test, the OR gate G10 outputs "1" and the AND gates G11 to G13 each output "0", and the outputs of the gates G10 to G13 are outputted as the read address signals RA1(0) to RA1(3) through the selector circuits SEL70 to SEL73. Assuming that the binary number "0001" represents the address 1, the fixed address FA1 is determined address 1.

Further, the AND gates G20, G22 and G23 each output "0" and the OR gate G21 outputs "1", and the outputs of the gates G20 to G23 are outputted as the read address signals RA2(0) to RA2(3) through the selector circuits SEL80 to SEL83. Assuming that the binary number "0010" represents the address 2, the fixed address FA2 is determined address 2.

Setting of addresses in binary representation may be implemented with configurations other than the above. Specifically, a configuration of FIG. 12 may be used to simplify the binary representation. In FIG. 12, outputs of the AND gates G30 to G33 are connected to respective ones of inputs of selector circuits SEL70 to SEL73.

Outputs of the OR gate G40 and the AND gates G41 to G43 are connected to respective ones of inputs of selector circuits SEL80 to SEL83.

In FIG. 12, the inverted signal of the LOGICTST signal is applied to the respective ones of inputs of the AND gates G30 to G33 and the AND gates G41 to G43, and the LOGICTST signal is applied to the OR gate G40.

When the LOGICTST signal of "1" is given in the logic test, the AND gates G30 to G33 each output "0", and the outputs of the gates G30 to G33 are outputted as the read address signals RA1(0) to RA1(3) through the selector circuits SEL70 to SEL73. Assuming that the binary number "0000" represents the address 0, the fixed address FA1 is determined address 0.

Further, the OR gate G40 outputs "1" and the AND gates G41 to G43 each output "0", and the outputs of the gates G40 to G43 are outputted as the read address signals RA2(0) to RA2(3) through the selector circuits SEL80 to SEL83. Assuming that the binary number "0001" represents the address 1, the fixed address FA2 is determined address 1.

The configuration of FIG. 12 is useful to eliminate redundant circuits as AND circuits, and a configuration of FIG. 13 may be also used for that.

In FIG. 13, outputs of the AND gates G31 to G33 are connected to respective ones of inputs of the selector circuits SEL81 to SEL83. Therefore, the AND gates G41 to G43 of FIG. 12 are not needed. That allows further reduction in circuit scale.

While the invention has been shown and described in detail, the foregoing description is in all aspects illustrative and not restrictive. It is therefore understood that numerous modifications and variations can be devised without departing from the scope of the invention.

I claim:

1. A semiconductor integrated circuit device, comprising:
    a multi-port RAM which can make a simultaneous access to a plurality of addresses; and
    a random logic portion for transferring a predetermined signal from/to said multi-port RAM,
    wherein said multi-port RAM comprises:
        a multi-port RAM core which is a main body of said RAM; and
        signal transfer means for transferring said predetermined signal between said RAM core and said random logic portion,
        wherein said signal transfer means comprises:
            read address supply means connected to an address input terminal of a read port of said RAM core; and
            a scan path circuit connected to an address input terminal of a write port of said RAM core, for supplying a predetermined address signal,
    wherein said read address supply means comprises:
        a first function for supplying said address input terminal of said read port with fixed data which are fixed to a predetermined value as first address data in a first operation mode of said semiconductor integrated circuit device;
        a second function for supplying said address input terminal of said read port with held data which are held in said scan path circuit as second address data in a second operation mode of said semiconductor integrated circuit device; and
        a third function for supplying said address input terminal of said read port with first data outputted from said random logic portion as third address data in a third operation mode of said semiconductor integrated circuit device,
    wherein said scan path circuit has a parallel input terminal for data and parallelly shifts at least second data outputted from said random logic portion to supply said address input terminal of said write port with said second data as said predetermined address signal,
    and wherein a data output terminal of said read port of said RAM core is directly given to said random logic portion.

2. The semiconductor integrated circuit device of claim 1, wherein
    said signal transfer means comprises data selection means receiving said first and second data outputted from said random logic portion, for selectively supplying either said first data or said second data for said parallel input terminal in response to a selection control signal.

3. The semiconductor integrated circuit device of claim 2, wherein
    said read address supply means further comprises:
        a first selector circuit for selectively outputting either said fixed data or said held data in response to a first control signal; and
        a second selector circuit for selectively outputting either said first data or an output of said first selector circuit in response to a second control signal,
    and wherein said first selector circuit selects and outputs said fixed data and said second selector circuit selects and outputs said output of said first selector circuit in said first operation mode,
    said first selector circuit selects and outputs said held data and said second selector circuit selects and outputs said output of said first selector circuit in said second operation mode, and
    said second selector circuit selects and outputs said first data in said third operation mode.

4. The semiconductor integrated circuit device of claim 2, wherein
    said read address supply means further comprises:
        a logic gate circuit receiving said held data and either said first control signal or an inverted signal of said first control signal, for performing a land operation and outputting a result of said logic operation; and
        a selector circuit for selectively outputting either said first data or an output of said logic gate circuit in response to said second control signal,
    wherein said output of said logic gate circuit is connected to one of inputs of said selector circuit, and said first data is supplied to the other input of said selector circuit,
    wherein said logic gate circuit has a logic to output a fixed value regardless of said held data in said first operation mode, and wherein said selector circuit selects and outputs said output of said logic gate circuit in said first and second operation modes, and said selector circuit selects and outputs said first data in said third operation mode.

5. The semiconductor integrated circuit device of claim 2, wherein said signal transfer means comprises selection control signal generation means for generating said selection control signal, and wherein said selection control signal generation means receives at least a control signal indicating whether said semiconductor integrated circuit device is in said first operation mode or not, said selection control signal generation means selects either said first data or said second data in said first operation mode, and said selection control signal generation means generates said selection control signal for controlling said data selection means so as to select only said second data at least in said third operation mode among said second and third operation modes.

* * * * *